US007378913B2

(12) United States Patent
Laiacano et al.

(10) Patent No.: US 7,378,913 B2
(45) Date of Patent: May 27, 2008

(54) OPTICALLY EXCITED ATOMIC FREQUENCY STANDARD

(75) Inventors: Adam Laiacano, Gloucester, MA (US); Cameron Everson, Swampscott, MA (US); Martin W. Levine, Manchester-by-the-Sea, MA (US)

(73) Assignee: Kernco, Inc., Danvers, MA (US)

( * ) Notice: Subject to any disclaimer, the term of this patent is extended or adjusted under 35 U.S.C. 154(b) by 29 days.

(21) Appl. No.: 10/579,949

(22) PCT Filed: Nov. 24, 2004

(86) PCT No.: PCT/US2004/039540

§ 371 (c)(1), (2), (4) Date: May 22, 2006

(87) PCT Pub. No.: WO2005/054907

PCT Pub. Date: Jun. 16, 2005

(65) Prior Publication Data

US 2007/0097365 A1 May 3, 2007

Related U.S. Application Data

(60) Provisional application No. 60/525,340, filed on Nov. 26, 2003.

(51) Int. Cl.
*H03L 7/26* (2006.01)
*H01S 1/06* (2006.01)

(52) U.S. Cl. ........................................ 331/3; 331/94.1

(58) Field of Classification Search .............. 331/94.1, 331/3

See application file for complete search history.

(56) References Cited

U.S. PATENT DOCUMENTS 6,320,472 B1 11/2001 Vanier

OTHER PUBLICATIONS

"Basic Polarization Techniques and Devices", Meadowlark Optics, Inc. 2003.

*Primary Examiner*—Arnold Kinkead
(74) *Attorney, Agent, or Firm*—Gordon E. Nelson

(57) ABSTRACT

An optically-excited atomic frequency standard that subjects alkali metal atoms (111) to circularly-polarized optical radiation. The atomic frequency standard is improved by the use of a circular polarizer (202) to control the intensity of the circularly-polarized optical radiation. The circular polarizer includes a linear polarizer (203) and a quarter-wave retarder (205), with the light to be circularly polarized passing first through the linear polarizer (203) and then through the quarter-wave retarder (205). In the atomic frequency standard, the optical radiation (105) to which the circular polarizer (202) is applied is itself linearly polarized, and the intensity of the circularly polarized light produced by the circular polarizer (202) is controlled by rotating (303) the circular polarizer. The degree of rotation determines how much of the linearly-polarized optical radiation passes through the linear polarizer, and thus how much circularly-polarized light is produced.

8 Claims, 5 Drawing Sheets

401

OPTICALLY EXCITED ATOMIC FREQUENCY STANDARD

CROSS REFERENCES TO RELATED APPLICATIONS

The present patent application claims priority from U.S. Provisional Patent Application 60/525,340, Laiacano, et al, Apparatus for varying the amount of optical attenuation, filed Nov. 26, 2003. The subject matter of the present patent application is an improved coherent population trapping atomic frequency standard employing the an innovative technique for controlling the intensity of the circularly-polarized light required for operation of the frequency standard. A frequency standard of a type in which the improvement may be made is disclosed in detail in U.S. Pat. No. 6,320,472, Jacques Vanier, Atomic Frequency Standard, issued Nov. 20, 2001. That patent is incorporated by reference herein for all purposes.

BACKGROUND OF THE INVENTION

1. Field of the Invention

The invention relates generally to the field of atomic frequency standards and particularly to atomic frequency standards which are optically excited using a technology known as Coherent Population Trapping (CPT) Atomic Frequency Standards.

2. Description of Related Art

A CPT atomic frequency standard is an "atomic clock" based on the phenomenon of coherent population trapping (CPT). Like most clocks, atomic clocks use phenomena with a regular time period to measure time. In atomic clocks, the phenomena with the regular period involve atoms that make transitions between two energy levels at angular frequency $\omega_o$. In most atomic clocks realized up to now using alkali metal atoms, these energy levels are part of the ground state of the atoms. The angular frequency $\omega_o$ of these transitions is typically in the microwave range, 6.834 . . . GHz for rubidium 87, for example. The transitions can be detected by several means and among others through emission or absorption or energy at the resonance frequency, or when excited at that resonance frequency, by means of effects on a light beam interacting with the same atoms.

In coherent population trapping, the atoms are subjected to circularly-polarized optical radiation at two angular frequencies $\omega_1$ and $\omega_2$ connecting the two levels of the ground state to a third level called the excited state. When the frequency difference $(\omega_1-\omega_2)$ of the optical radiation fields is not exactly equal to the ground state resonance frequency $\omega_o$, the atoms are not trapped in the ground state. They can absorb energy from the optical radiation fields and enter the excited state. The resonance phenomenon in the ground state at frequency $\omega_o$ is thus observed directly as a reduction in the transmitted radiation. When the difference frequency $(\omega_1-\omega_2)$ is exactly equal to the atomic resonance frequency $\omega_o$ in the ground state, the atoms cannot absorb the electromagnetic radiation or be excited to the excited state. As a consequence, there is a sharp decrease in the absorption of the transmitted light. This "bright line" in transmission is used to lock an radio-frequency oscillator to the difference frequency $(\omega_1-\omega_2)$.

FIG. 1 is a block diagram of a CPT frequency standard 101 of the type disclosed in U.S. Pat. No. 6,320,427, cited in the Cross references to related applications. At the highest level, frequency standard 101 works as follows: The current source 125 driving laser 103 is modulated by microwave generator 127 at frequency $\omega_o/2$. This has the effect of creating, in the output spectrum of the laser, sidebands spaced symmetrically on each side of the laser carrier frequency. These sidebands are separated by $\omega_o/2$ and their amplitude is given by Bessel functions $J_n$. The two first sidebands called $J_{1+}$ and $J_{1-}$ situated on each side of the carrier are thus separated by the frequency $\omega_o$. They are the sidebands used as the two circularly-polarized radiation fields $\omega_1$ and $\omega_2$. Under the excitation of these two sidebands, the atoms are trapped in the ground state, they cannot absorb the light from the laser, and virtually all of the light passes through resonance cell 111 to photodetector 113; when $(\omega_1-\omega_2)$ is not equal to $\omega_o$, the atoms are not trapped in the ground state, much more of the light is absorbed by the atoms in resonance cell 111 and much less light reaches photodetector 113. Photodetector 113 produces a current which is proportional to the amount of light that falls on it, and the current from photodetector 113 thus indicates when $(\omega_1-\omega_2)$ is equal to $\omega_o$ or not.

Microwave generator 127 is modulated at a low frequency. The modulation causes the frequency separation $(\omega_1-\omega_2)$ to vary periodically by a small amount and this in turn causes a low frequency periodic variation of the optical radiation at photodetector 113. This periodic variation is processed to lock the microwave generator to the atomic resonance at $\omega_o$. The frequency standard produced by clock 101 is derived from the locked frequency of the microwave generator.

Light originating from laser 103 which excites the atoms in resonance cell 111 must have certain properties in order to initiate the CPT process. The gas in cell 111 is excited by circularly-polarized light at the correct wavelength and optimum optical power. The correct wavelength is achieved by setting the temperature and drive current to the laser diode providing the light, the optical power of the laser beam is controlled by attenuator 107, and circular polarization is achieved by properly aligning quarter wave retarder 109 with regard to the plane of polarization of laser light 105. In the past one adjusted the optical power by using an attenuating material (film, glass, or otherwise) placed in the beam path to reduce its intensity. The attenuating material can be placed on either side of the quarter wave retarder. In a very small system, optimization of the optical intensity is adjusted by selecting a discrete optical attenuator. Best results are generally achieved using glass neutral-density filters, but these can be quite expensive and take up larger amounts of space. They also do not come in a very wide selection of values, so they must either be paired together, taking up even more space, or a sacrifice in optimum optical power must be made.

As described above, adjusting the optical intensity has been done in the past by installing and removing attenuators. Adjusting the circular polarization has been done by rotating the quarter wave retarder relative to the plane of polarization of laser light 105 and using an external linear polarizer or other appropriate means to determine the state of polarization resulting from the rotation. However, any calibration which requires that components of the device be replaced or that calibration components be added to the device and manipulated in the device is undesirable. For example, extra space is required for the combinations of attenuators that are needed to attain the optimum optical power and for the equipment required to analyze the polarization of the light entering resonance cell 111. Further, installation and removal of the analysis equipment and/or installation and removal of the attenuators often disturbs the alignment of CPT frequency standard 101 generally and of quarter-wave retarder 109 in particular. Another related problem is that adjustment techniques which require installation and/or removal of attenuators or analysis equipment cannot be performed automatically by the CPT frequency standard itself. What is needed, and what is provided by the present invention, is a technique for adjusting the optical intensity and circular polarization of the laser beam which requires neither installation and removal of the analysis equipment nor use of attenuator 107. As will be apparent from the foregoing discussion, such a technique is useful not only in CPT frequency standards, but in any application in which circularly-polarized light of precisely-controlled intensity is required. It is thus an object of the invention to provide such a technique.

An important property of optical radiation is the polarization state. There are two basic polarization states: linear polarization and elliptical polarization. As noted above, in the present context, we are chiefly interested in circular polarization, a special case of elliptical polarization. In circular polarization, the electrical field rotates around the line upon which the optical wave propagates, unlike linear polarization in which the electrical field of the optical wave moves in planes that contain the line along which the optical wave propagates. A good elementary discussion of polarization was found in August, 2004 at www.meadowlark-.com/AppNotes/Appnote%20PDF/Basic%20Polarization%20Techniques%20and%20Devices.pdf. That discussion is hereby incorporated by reference in the present patent application.

The linear polarizer has a polarizing axis, and when light propagates through a linear polarizer, the emergent light is linearly polarized in the plane of the polarizing axis. If light that is already linearly polarized is input to a linear polarizer, only the component of the linearly-polarized light that is parallel to the polarizing axis emerges; the remainder of the light is absorbed or reflected. Thus a linear polarizer can thus be used to attenuate linearly-polarized light.

Circularly-polarized light is produced by passing light through a circular polarizer. A circular polarizer has two components, a linear polarizer and a quarter-wave retarder, which are assembled in a specific orientation. A quarter-wave retarder is made from a birefringent, uniaxial material having two different refraction indices. Light polarized along the direction with the smaller index travels faster and thus this axis is termed the fast axis. The other axis is the slow axis. In the circular polarizer, there is a fixed orientation of the axis of polarization of the linear polarizer to the fast axis of the quarter-wave retarder. An orientation of 45° results in the most efficient conversion of the linearly-polarized light emerging from the linear polarizer to circularly-polarized light, but circular polarization can occur at other orientations as well.

SUMMARY OF THE INVENTION

In accordance with the invention a coherent population trapping atomic frequency standard compromising a linearly-polarized laser excitation source and a sealed resonance cell containing atomic resonance atoms is provided with a combined circular-polarizing and intensity control arrangement. The foregoing object of the invention is attained by providing a beam of linearly-polarized light from a laser source to a circular polarizer and rotating the circular polarizer around an axis that is parallel to the beam of linearly-polarized light. The relationship between the axis of polarization of the linear polarizer component of the circular polarizer and the plane of polarization of the beam of linearly-polarized light determines how much light passes through the circular polarizer's linear polarizer into the circular polarizer's quarter-wave retarder and the fixed angle between the axis of polarization of the linear polarizer and the fast axis of the quarter-wave retarder insures that much of the light that passes through the linear polarizer emerges circularly polarized. Simply rotating the circular polarizer causes the intensity of the circularly-polarized light to continuously and smoothly vary while maintaining the degree of circular polarization essentially constant.

Other aspects of the attenuating circular polarizer include the following:

- the linearly-polarized beam of light may be produced by a laser or by a linear polarizer;
- the linear polarizer and the quarter-wave retarder are oriented to each other during rotation such that the conversion of light which passes through the linear polarizer from linear polarization to circular polarization is maximized; and
- the linear polarizer and the quarter-wave retarder are rotated as a unit.

The technique of using a circular polarizer to adjust the intensity of a beam of circularly-polarized light may be employed in an atomic frequency standard of the type in which a beam of circularly-polarized light passes through an alkali vapor resonance cell. Other objects and advantages of the invention will be apparent to those skilled in the arts to which the invention pertains upon perusal of the following Detailed Description and drawing, wherein:

Figure 1:
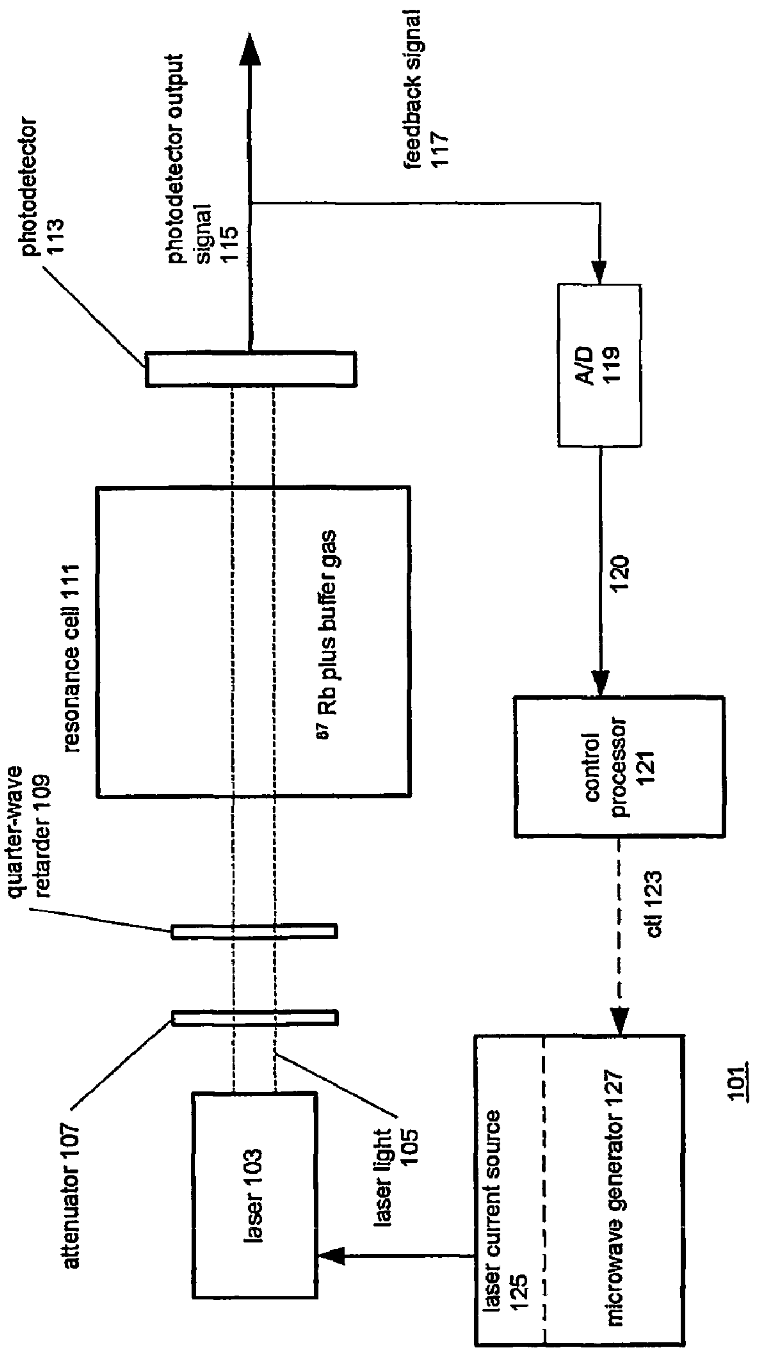
Fig. 1 Prior Art
FIG. 1 is an overview of a prior art CPT frequency standard.

Reference numbers in the drawing have three or more digits: the two right-hand digits are reference numbers in the drawing indicated by the remaining digits. Thus, an item with the reference number 203 first appears as item 203 in FIG. 2.

DETAILED DESCRIPTION

The following Detailed Description will describe a CPT frequency standard employing a rotatable circular polarizer to control the intensity of circularly-polarized light incident on the atomic resonance cell, and will finally disclose experimental results using a circular polarizer in this fashion in the CPT frequency standard.

Figure 2:
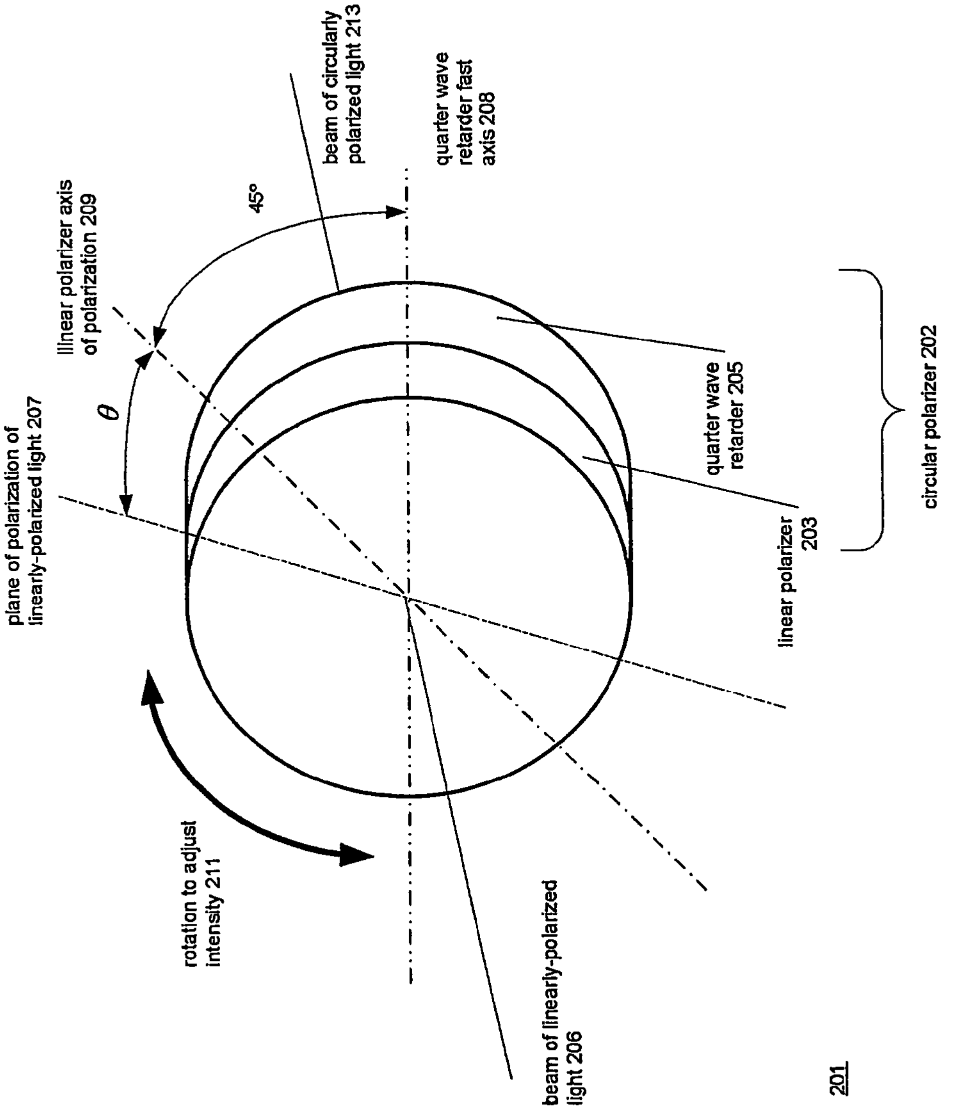
FIG. 2 is a diagram of a circular polarizer through which a beam of linearly polarized light is passing.

Using a Circular Polarizer to Control the Intensity of Circularly-Polarized Light: FIG. 2

FIG. 2 shows at 201 how a circular polarizer 202 may be used to control the intensity of circularly-polarized light. Circular polarizer 202 is made in the usual fashion: a linear polarizer 203 is combined with a quarter wave retarder 205 such that there is a fixed relationship between the axis of polarization 209 and the fast axis 208 of the quarter wave retarder. The linear polarizer and quarter wave retarder may be made of any materials which polarize light in the required fashions. A preferred relationship between the axis of polarization 209 and fast axis 208 is 45°, but any relationship which results in circularly-polarized light may be used. The light 206 that is input to circular polarizer 202 is itself linearly polarized. Its plane of polarization is shown at 207. Linearly polarized light 206 may be produced by a laser or by passing light through another linear polarizer. The light that is output from circular polarizer 202 is a beam of circularly polarized light 213. The intensity of circularly polarized beam 213 may be varied by rotating circular polarizer 202 as shown at 211. Arrangement 201 may be used in any situation in which circularly-polarized light of a controlled intensity is required. An example of such a situation is CPT frequency standard 101 of FIG. 1, in which the circularly polarized light required for resonance cell 111 is produced by quarter-wave retarder 109 from the linearly-polarized light produced by laser 103

Technique 201 takes advantage of two characteristics of linear polarizers:

- when light that is already linearly polarized passes through a linear polarizer, the amount of light that passes through the linear polarizer is a function of the angle θ between the axis of polarization of the linearly polarized light and the axis of polarization of the linear polarizer. As θ ranges between 0°, that is, where the axis of polarization 209 of the linear polarizer is the same as the plane of polarization 207 of the linearly polarized light, and 90°, that is, where axis of polarization is perpendicular to the plane of polarization, the amount of light that passes through ranges from nearly all to nearly none.
- when linearly-polarized light is passed through a linear polarizer, the electric field of the emerging linearly-polarized light is oriented along the axis of polarization of the linear polarizing medium. The linear polarizer thus serves to rotate the plane of polarization of the incident linearly-polarized light.

Because the relationship between axis of polarization 209 of linear polarizer 203 and fast axis 208 of quarter wave retarder 205 is fixed, the behavior of circular polarizer 202 is unaffected by rotation 211 of circular polarizer 202. Because the amount of light that passes through linear polarizer 203 is a function of the angle θ, the amount of circularly polarized light 213 produced by circular polarizer 202 is also a function of θ. Consequently, the intensity of the circularly-polarized light which leaves quarter-wave retarder 205 may be adjusted by rotating circular polarizer 202 about beam 206.

The two elements of circular polarizer 202, linear polarizer 203 and quarter-wave retarder 205, may be made of any materials which suit the particular application and may be coupled to each other by any technique which maintains a fixed relationship between the axis of polarization of linear polarizer 203 and the fast axis of quarter-wave retarder 205. Circular polarizer 202 may be rotated about beam of linearly-polarized light 206 using any mechanism which permits circular polarizer 202 to be rotated sufficiently to provide the desired range of attenuation. For many applications it will be important that circular polarizer 202 be locked at the point at which the desired attenuation is achieved; this can be done using mechanisms such as set screws, clamps, or a worm gear that interacts with teeth around the circumference of circular polarizer 202.

Figure 3:
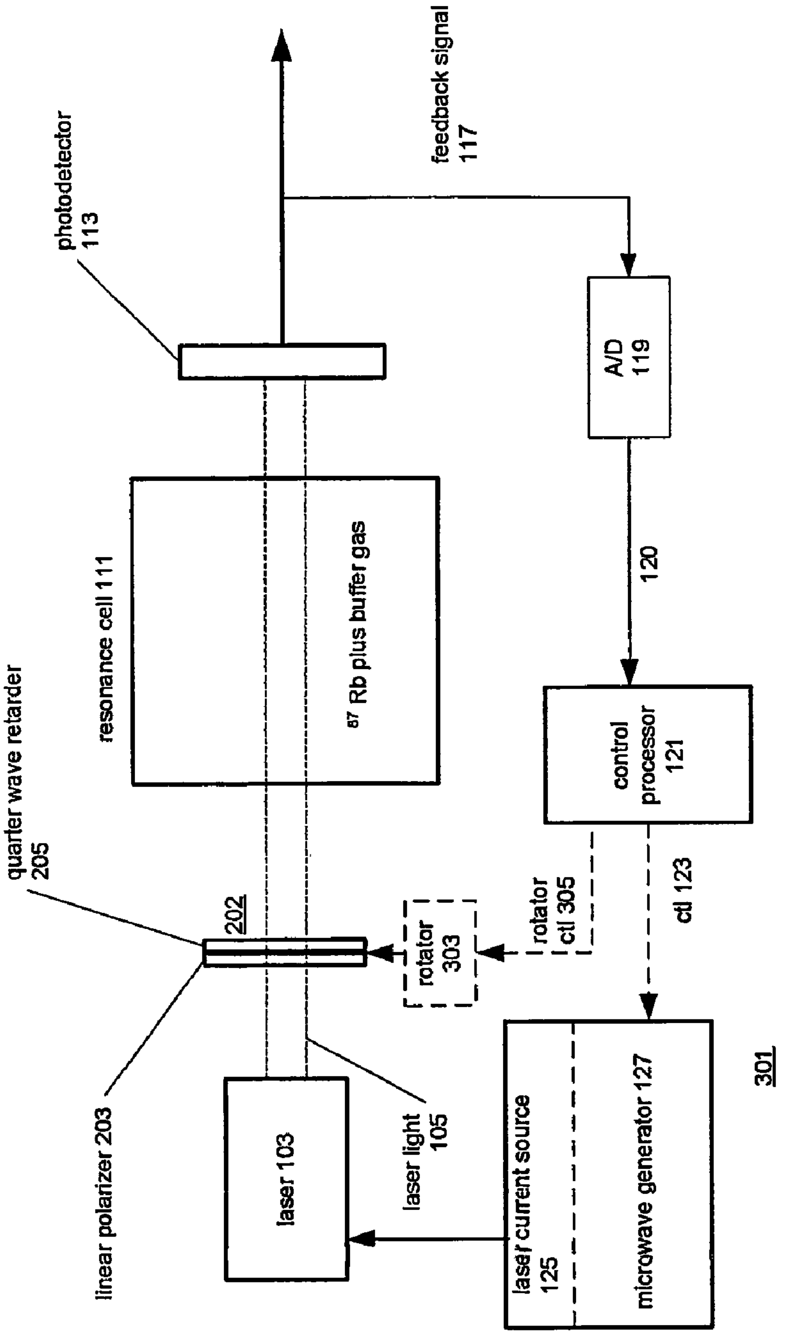
FIG. 3 is a CPT frequency standard in which the circular polarizer of FIG. 2 is employed.
Figure 4:
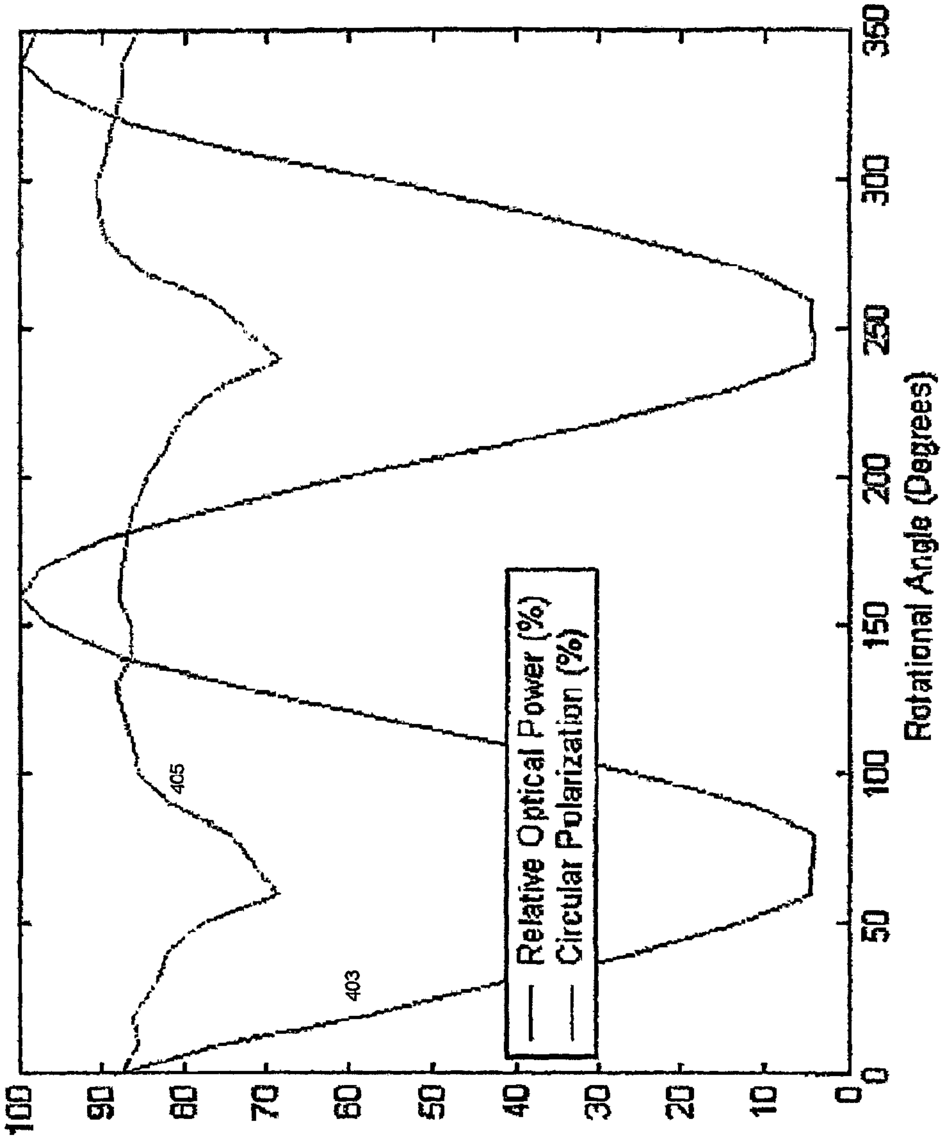
FIG. 4 is a plot of the relationship between amount of circular polarization and optical power as the circular polarizer of FIG. 2 is rotated.

A CPT Frequency Standard which Incorporates Technique 201: FIGS. 3 and 4

FIG. 3 shows a CPT frequency standard 301 which incorporates technique 201. As may be seen from FIG. 3, the only difference between CPT frequency standard 301 and CPT frequency standard 101 is that attenuator 107 and quarter-wave retarder 109 have been replaced by circular polarizer 202. Because circular polarizer 202 may be rotated around laser light beam 105 to adjust the intensity of the circularly-polarized light reaching resonance cell 111, there is no need to add and remove attenuators or to separately adjust the quarter-wave retarder. CPT frequency standard 101 uses photodetector 113 to measure the amount of laser light which passes through resonance cell 111, and when CPT frequency standard 301 is being calibrated, photodetector 113 can be used to determine the degree to which circular polarizer 202 is attenuating laser light 105. In frequency standard 301, as in any other system which provides feedback 117 concerning the amount of light that is passing through circular polarizer 202, the light intensity can be made automatically controlled: a rotator 303 such as a servomotor can be added to rotate the circular polarizer 202 and the rotator can be controlled by rotator control signal 305, which control processor 121 can derive from feedback signal 117. The elements 303 and 305 required to make the attenuation self-adjusting are shown in dotted lines in FIG. 3. It should be noted here that embodiments of CPT frequency standard 301 are possible in which beam of light 105 is not linearly polarized; in that case, a fixed linear polarizer would be placed in the path of beam 105 ahead of circular polarizer 202 in order to produce the linearly polarized light required by technique 201.

Figure 5:
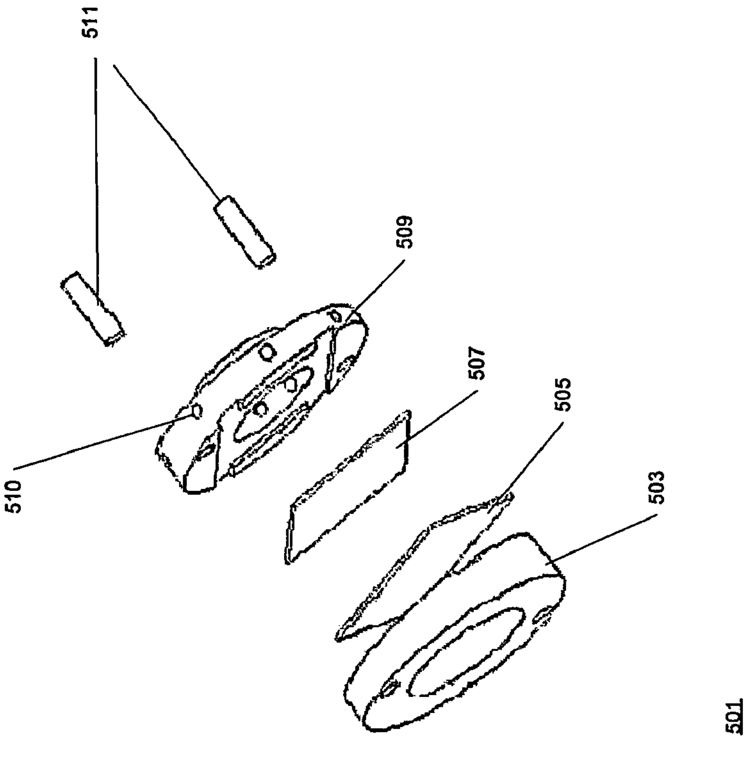
FIG. 5 shows a preferred embodiment of the circular polarizer.

FIG. 5 shows a presently-preferred embodiment 501 of circular polarizer 202. Linear polarizer 505 is a color Pol® polarizer made by CODIXX AG, Barleben, Germany; quarter-wave retarder 507 is an Optigrafix™ quarter-wave retarder made by Grafix® Plastics, Cleveland, Ohio, USA. Linear polarizer 505 and quarter-wave retarder 507 are held in the proper relationship to each other by linear polarizer holder 503 and quarter-wave retarder holder 509, which are in turn held together by pins 511. When circular polarizer 501 is installed in frequency standard 301, it is held in a mount by friction. The edge of quarter-wave retarder 507 has holes 510 which permit a tool to engage circular polarizer 501 and rotate circular polarizer 501. The effect of the rotation on the intensity of the light reaching resonance cell 111 can be determined from the output of photodetector 113, and when the light has the proper intensity, circular polarizer 501 may be locked in that position either by increasing the friction between the mount and circular polarizer 501 or by gluing circular polarizer 501 to the mount.

FIG. 4 is a plot showing the effectiveness of technique 201 with circular polarizer 501. Curve 403 shows how the power of the light which passes through circular polarizer 501 varies as the circular polarizer is rotated through 360°; the optical power ranges from a maximum of 100% through a minimum of about 5%. Curve 405 shows how the degree of circular polarization varies during the rotation. The degree of circular polarization ranges from a maximum of 87% to a minimum of about 70%; however, it remains between about 85% and 87% for most of the range of optical power. Technique 201 thus provides a large range of attenuation over which the degree of attenuation has little effect on the degree of circular polarization.

CONCLUSION

The foregoing Detailed Description has disclosed to those skilled in the relevant technologies how to control the intensity of circularly-polarized light using the technique and has further disclosed the best mode presently known to the inventors of using the technique and of making a device that employs the technique. It will be immediately apparent to those skilled in the relevant technologies that as long as the circular polarizer is applied to linearly polarized light, the circular polarizer can be of any size and be made using any available techniques. Similarly, any available technique can be used for rotating the circular polarizer. It will further be immediately apparent that the technique may be used not only in CPT atomic frequency standards, but in any device that requires adjustment of the intensity of circularly-polarized light. For all of the foregoing reasons, the Detailed Description is to be regarded as being in all respects exemplary and not restrictive, and the breadth of the invention disclosed here in is to be determined not from the Detailed Description, but rather from the claims as interpreted with the full breadth permitted by the patent laws.

What is claimed is:

1. An improved frequency standard of the type wherein a beam of circularly-polarized light passes through an alkali vapor resonance cell, the improved frequency standard being characterized in that:

the beam of circularly-polarized light is produced by passing a beam of linearly-polarized light through a circular polarizer, the circular polarizer being rotatable around an axis that is parallel to the beam of light, the circular polarizer includes a linear polarizer and a quarter wave retarder, whereby the intensity of the circularly-polarized beam is controlled by rotating the circular polarizer wherein during rotation, an axis of polarization of the linear polarizer and a fast axis of the quarter wave retarder have a fixed orientation to each other, wherein the linear polarizer and the quarter wave retarder are rotated as a unit.

2. The improved frequency standard set forth in claim 1 further characterized in that:

the beam of linearly-polarized light is produced by a laser.

3. The improved frequency standard set forth in claim 1 further characterized in that:

the beam of linearly-polarized light is produced by a second linear polarizer.

4. The improved frequency standard set forth in claim 1 wherein:

during rotation, the linear polarizer and the quarter wave retarder are oriented to each other such that the conversion of light which reaches the quarter wave retarder to circular polarization is maximized.

5. The improved frequency standard set forth in claim 4 wherein:

the axis of polarization of the linear polarizer and the fast axis of the quarter wave retarder are oriented to each other at an angle of 45°.

6. A method employed in a frequency standard of the type wherein a beam of circularly-polarized light passes through an alkali vapor resonance cell to control the intensity of the beam of circularly-polarized light the circularly-polarized light being produced by passing a linearly polarized beam of light through a circular polarizer, the circular polarizer being rotatable about an axis that is parallel to the beam of light, and the method comprising the steps of:

rotating the circular polarizer, the circular polarizer including a linear polarizer and a quarter wave retarder, wherein during rotation, an axis of polarization of the linear polarizer and a fast axis of the quarter wave retarder have a fixed orientation to each other, wherein the linear polarizer and the quarter wave retarder are rotated as a unit; and determining the intensity of the beam, the steps being repeated until a desired intensity has been obtained.

7. The method set forth in claim 6 further comprising the step of:

preventing further rotation of the circular polarizer after the desired intensity has been obtained.

8. The method set forth in claim 6 wherein:

the beam of circularly polarized light strikes a device which measures the intensity of the beam; and the steps of the method are automatically performed in response to changes in the intensity of the beam as measured by the device.

* * * * *